United States Patent [19]

Webb

[11] Patent Number: 4,586,067
[45] Date of Patent: Apr. 29, 1986

[54] PHOTODETECTOR WITH ISOLATED AVALANCHE REGION

[75] Inventor: Paul P. Webb, Beaconsfield, Canada

[73] Assignee: RCA Inc., Toronto, Canada

[21] Appl. No.: 650,680

[22] Filed: Sep. 14, 1984

[30] Foreign Application Priority Data

Apr. 10, 1984 [CA] Canada ................................. 451682

[51] Int. Cl.[4] ...................... H01L 27/14; H01L 31/00
[52] U.S. Cl. ........................................ 357/30; 357/13; 357/56
[58] Field of Search ...................... 357/30, 13, 16, 61, 357/55, 56

[56] References Cited

U.S. PATENT DOCUMENTS

| 4,116,733 | 9/1978 | Olsen et al. | 148/175 |
| 4,442,444 | 4/1984 | Osaka | 357/13 |
| 4,471,370 | 9/1984 | Chen et al. | 357/30 |
| 4,473,835 | 9/1984 | Forrest et al. | 357/13 |
| 4,481,523 | 12/1984 | Osaka et al. | 357/13 |

OTHER PUBLICATIONS

Nishida et al. Applied Physics Letters 35, 251 (1979).
Olsen et al. Journal of Electronic Materials 9, 977 (1980).

Primary Examiner—James W. Davie
Assistant Examiner—Georgia Y. Epps
Attorney, Agent, or Firm—Birgit E. Morris; Donald S. Cohen; William J. Burke

[57] ABSTRACT

The invention relates to an avalanche photodetector having a charge-multiplication region which is spatially separated from the detector surfaces. This photodetector includes an absorptive region, a first region overlying the absorptive region and having a higher concentration zone and a surrounding peripheral zone and a second region overlying the first region. The high electric field in the avalanche region is then restricted to the higher conductivity central zone thereby reducing the electric field at the detector surfaces when a reverse-bias voltage sufficient to produce avalanche multiplication is applied to the detector.

10 Claims, 4 Drawing Figures

PHOTODETECTOR WITH ISOLATED AVALANCHE REGION

The Governments of the United States of America and Canada have rights in this invention pursuant to Canadian Sub-Contract No. 14SU70C33-81-R-0122 under Contract No. F19628-82-C-0038 awarded by the United States Department of the Air Force.

The invention relates to an avalanche photodetector having a lower electric field at the P-N junction periphery thereby reducing the surface leakage current and the likelihood of edge breakdown.

BACKGROUND OF THE INVENTION

Optical communication systems which operate in the wavelength range from 1100 to 1700 nanometers (nm) are of potentially great importance because the dispersion and losses in an optical fiber are typically very low in this wavelength range. Heterojunction devices incorporating binary III-V alloys and solid solutions of these alloys have been found to be particularly useful for this application because their electronic bandgaps occur in this wavelength range and lattice-matched heterojunctions can be obtained by compositional variations. In particular, ternary and quaternary alloys of In, Ga, As and P on an InP substrate have been found to be useful materials for both light-emitters and detectors.

Problems which have affected the performance of avalanche photodetectors using these materials include bulk tunneling currents which occur at electric fields of the order of $1.5 \times 10^5$ V/cm in the ternary and quaternary compounds used for the light-absorptive region, edge breakdown and multiplication of surface leakage currents at the junction periphery. The tunneling has been reduced by locating the P-N junction with its high electric field in a wide bandgap material separated from the light-absorptive region in the narrower bandgap material. This is the so-called SAM (Separated Absorbing and Multiplying) avalanche photodetector structure.

Edge breakdown and surface currents have been reduced by the use of surface contouring of the detector sidewalls. However, the electrical field reduction at the surface may be small with the result that the surface dark current may still undergo multiplication. Therefore, it is desirable to further reduce the electric field at the junction periphery to further limit the surface electric field and current.

SUMMARY OF THE INVENTION

An avalanche photodetector includes an absorptive region of first conductivity type, a first region of first conductivity type overlying the absorptive region and having a surface comprising a center area and a surrounding peripheral area, with a higher conductivity zone extending a distance towards the absorptive region from the center area and a second region of opposite conductivity type overlying the first region. The high electric field needed for avalanche multiplication is then restricted to the higher conductivity zone and does not extend to the junction periphery at the detector surface.

DETAILED DESCRIPTION OF PREFERRED EMBODIMENTS

Figure 1:
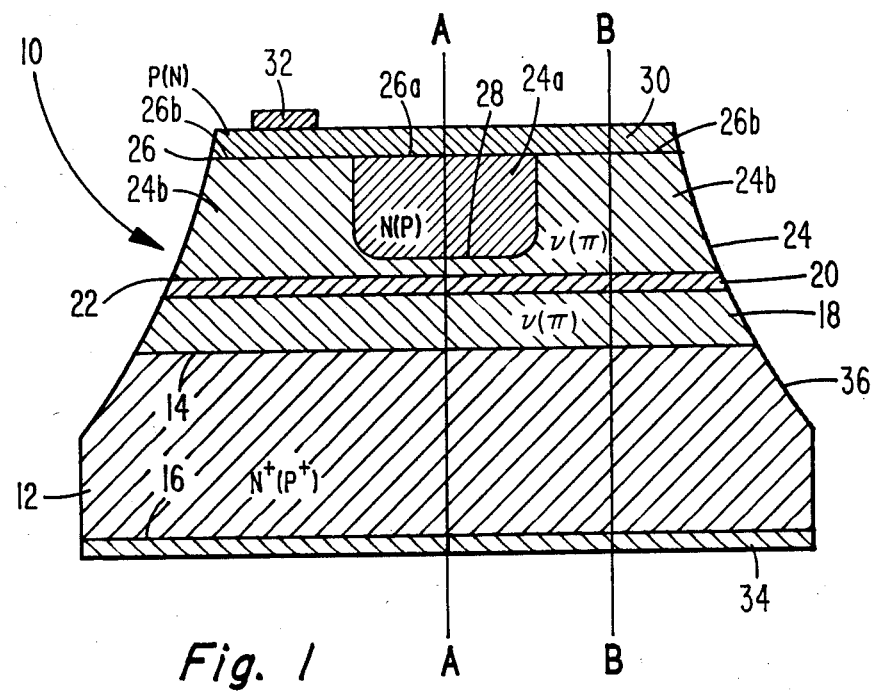
FIGS. 1 and 2 are cross-sectional views of two embodiments of the avalanche photodetector of the invention.
Figure 2:
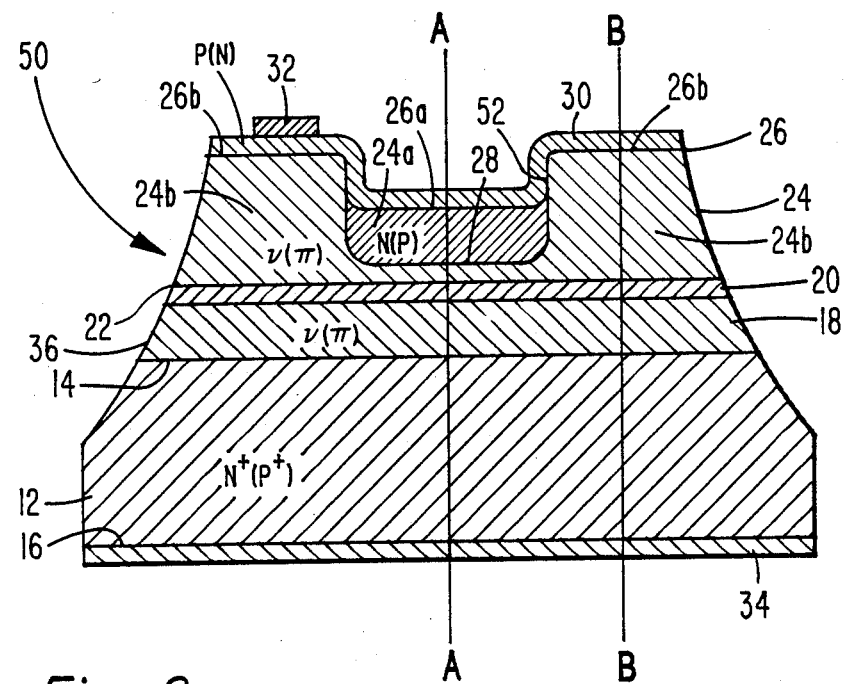

In FIGS. 1 and 2 the same numerical identification is used for the same elements.

The photodetector 10 of FIG. 1 includes a substrate 12 having first and second major surfaces 14 and 16, respectively, and an absorptive region 18 overlying the first major surface 14. A buffer region 20 overlies the absorptive region 18 and has a surface 22. A first region 24 overlies the surface 22, has a surface 26 comprising a central surface area 26a surrounded by a peripheral surface area 26a and includes a higher conductivity zone 24a which extends a distance from the central surface area 26a towards the surface 22. The higher conductivity zone 24a is surrounded by a relatively lower conductivity peripheral zone 24b with an interface 28 between the two portions. A second region 30 overlies the surface 26. A first electrical contact 32 overlies the second region 30. A second electrical contact layer 34 overlies the second major surface 16. The photodetector 10 also has a contoured sidewall 36.

The photodetector 50 of FIG. 2 includes a well 52 extending a distance into the first region 24 towards the surface 22. The central area 26a is the surface of the bottom of the well 52. The higher conductivity zone 24a extends a further distance into the first region 24 from the central area 26a towards the surface 22. The second region 30 overlies the surface 26 including the bottom and sidewalls of the well 52.

The substrate 12 and the absorptive, buffer and first regions 18, 20 and 24 are of the same conductivity type and the second region 30 is of the opposite conductivity type. This arrangement produces a P-N junction at the surface 26 between the second region 30 and the first region 24. The materials comprising the absorptive, buffer, first and second regions 18, 20, 24 and 30, respectively, are preferably chosen such that their lattice constants are matched to that of the substrate 12 to within about 0.5 percent.

The substrate 12 is typically composed of a semiconductor material such as N-type InP doped with sulfur to a concentration of about $5 \times 10^{18}/cm^3$, has sufficient thickness to support the remainder of the structure and is typically between about 0.03 and 0.04 cm thick. The major surface 14 is typically treated with Caro's acid and a one percent bromine-in-methanol solution to remove surface contamination and damage prior to the deposition of the layers.

The absorptive region 18 is composed of a material which absorbs light at the wavelength of interest in the range between 1100 and 1700 nm. Suitable materials include $In_{0.53}Ga_{0.47}As$ which absorbs at wavelengths less than 1650 nm and $In_xGa_{1-x}As_yP_{1-y}$ which absorbs light at wavelengths less than a maximum wavelength determined by the choice of x and y as disclosed, for example, by Olsen et al. in the Journal of Electronic Materials 9, 977 (1980). This layer is preferably slightly ν-type conducting and is typically deposited as undoped material containing less than about $3 \times 10^{15}$ donors/$cm^3$. This region is preferably greater than about 2 micrometers (μm) thick to provide complete absorption of the incident light.

The buffer region 20 is composed of a material, typically $In_aGa_{1-a}As_bP_{1-b}$ having a bandgap energy between that of the absorptive and the first regions 18 and 24 and is typically about 0.5 μm thick. The concentration of conductivity modifiers is preferably the same as that in the absorptive region 18. This region is present to avoid the slow detector response associated with the accumulation of charge carriers near the valence-band discontinuity at the heterojunction with the first region but may be omitted.

The first region 24 is typically composed of a semiconductor material such as InP. For the photodetector 10 this region is between about 1 and 3 μm thick and for the photodetector 50 it is between about 2 and 6 μm thick. In each case the excess conductivity modifier concentration should be less than $10^{16}/cm^3$. The well 52 typically extends a distance between about 1 and 4 μm into the first region 24.

The higher conductivity zone 24a has a thickness between about 1 and 2 μm and a conductivity modifier concentration sufficient to produce avalanche multiplication of carriers photogenerated in the absorptive region 18 when a reverse-bias of sufficient magnitude is applied between the electrical contacts 32 and 34. The total areal concentration of conductivity modifiers is typically between about 2.5 and $4 \times 10^{12}/cm^2$. Since this zone is typically formed by ion implantation and/or diffusion, the distribution of conductivity modifiers decreases with distance from the surface 26a. This zone should extend to within less than 0.5 μm of the surface 22.

The second region 30 is typicaly composed of a transmissive semiconductor material, such a P-type InP, containing an excess of about $10^{18}$ zinc acceptors/$cm^3$ and having a thickness between about 1 and 2 μm.

The substrate 12 and the first and second regions 24 and 30 are preferably light-transmissive at the wavelength to be detected.

The first electrical contact 32 is composed of a gold-/zinc alloy deposited by vacuum evaporation if the second region 30 is P-type and is preferably configured so that light enters the detector through that part of the second region 30 over the central area 26a. The second electrical contact 34 is composed of a gold/tin alloy deposited by vacuum evaporation if the substrate 12 is N-type.

In the operation of the photodetector of the invention a reverse-bias voltage is applied between the electrical contacts. The depletion region along the line A—A of FIG. 1 extends through the higher conductivity zone 24a into the absorptive region 18. Assuming the buffer region 20 as part of the absorptive region 18 and that the interface 28 contacts the surface 22, the electric field is:

$$E_M = \frac{q}{\epsilon}(N_t + N_0 w)$$

where q is the electronic charge, $\epsilon$ is the dielectric constant, $N_t$ is the total area concentration of conductivity modifiers in the higher conductivity zone 24a, $N_0$ is the conductivity modifier concentration and w is the depletion region width in the absorptive region 18. The first term represents the field necessary to deplete the higher conductivity zone 24a and reaches a value of about $4.5 \times 10^5$ V/cm when this zone is fully depleted. A further increase in the applied voltage causes the depletion region to extend into the absorptive region. The electric field in the absorptive region does not increase beyond about $1.5 \times 10^5$ V/cm before an electric field $E_M$ sufficient for avalanche breakdown is reached in the higher conducting zone 24a. This electric field distribution along the line A—A is illustrated as a solid line curve in FIG. 3 where the abscissa is labelled with the surfaces of the different regions as in FIG. 1.

For the photodetector 10 of FIG. 1 the peripheral zone 24b will also fully deplete with the application of the reverse-bias voltage. However, since this region is more lightly doped, the maximum electric field $E_p$ along the line B—B of FIG. 1 will be less than that in the higher conductivity zone 24a and also less than the field required for avalanche multiplication. The electric field in the underlying portion of the absorptive region 18 will be correspondingly higher and extend to a greater depth. This electric field distribution is schematically illustrated as the broken curve in FIG. 3. The maximum field $E_p$ is given by:

$$E_p = \left(\frac{q}{\epsilon} N_2 x_p\right) + \left(\frac{q}{\epsilon} N_0 w_p\right)$$

where $N_2$ is the volume concentration in the peripheral zone 24b, $x_p$ is the total thickness of the peripheral zone 24b and $w_p$ is the depletion depth into the peripheral part of the absorptive region 18. The first term is the field to deplete the peripheral zone 24b and the second term is the field at surface 22.

Figure 4:
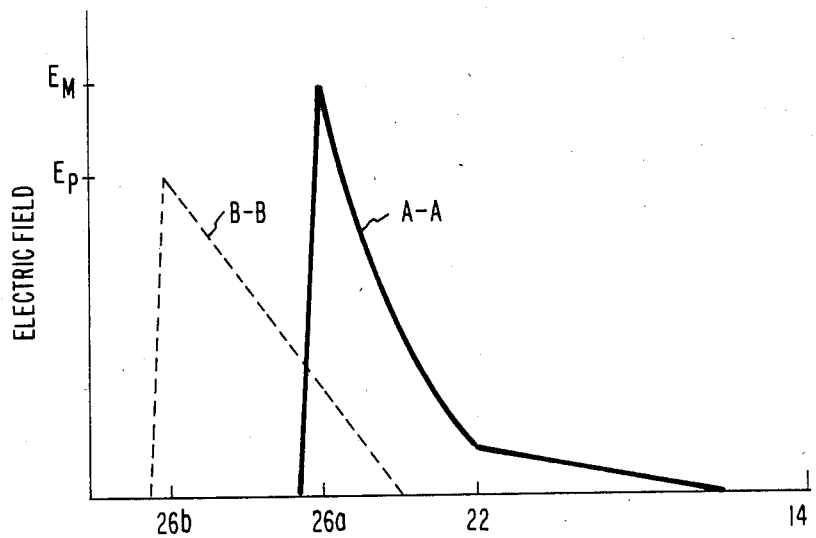

For the photodetector 50 of FIG. 2 the electric field distribution as shown in FIG. 4 differ from those for the photodetector 10 in that the peripheral zone 24b is not typically fully depleted because of its low doping level and greater thickness. The peak fields are spatially separated because of the presence of the well 52.

The peripheral zone 24b is preferably thick enough that the depletion layer does not extend into the buffer region 20. In this case the maximum field $E_p$ is:

$$E_p = \left(\frac{2qN_2V}{\epsilon}\right)^{\frac{1}{2}}$$

where V is the total voltage applied.

Figure 3:
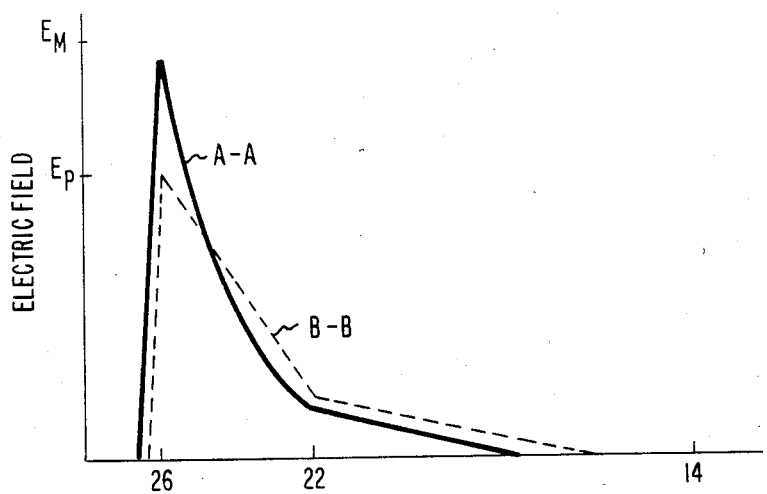
FIGS. 3 and 4 are graphical illustrations of the electric field distributions along the lines A—A and B—B of FIGS. 1 and 2, respectively.

In each case, the voltage for avalanche is the integral of the electric field over the full width of the depletion regions, i.e., the area under the solid curves in FIGS. 3 and 4. For either case the parameters of thickness and impurity concentration are preferably chosen to give an avalanche voltage in the central region between 25 and 75 volts, and a peak field $E_p$ less than $4 \times 10^5$ V/cm.

The semiconductor regions may be sequentially formed on the substrate surface using liquid-phase or, preferably, vapor-phase epitaxy techniques as those disclosed by Olsen et al. In U.S. Pat. No. 4,116,733, incorporated herein by reference.

The photodetector 10 may be formed by sequentially depositing ν-type absorptive and buffer layers and a first ν-type InP layer on a major surface of an N-type InP substrate wafer using vapor-phase epitaxy techniques. Portions of the surface of the first layer are covered with an $SiO_2$ ion-implantation or diffusion mask. An N-type conductivity modifier, typically sulphur, is introduced into the first region, typically by ion implantation followed by a diffusion/activation step, to produce the higher conductivity zone 24a. After removal of the diffusion mask, a second P-type InP layer is deposited on the first layer. An electrically conducting layer is then deposited on the second layer and the electrical contact is defined using photolithographic techniques. Mesas are then etched into the layers and the diodes are separated using conventional techniques. The high-conductivity zone can also be formed in the exposed surface of the second layer using ion implantation and/or diffusion techniques.

The photodetector 50 may be formed by forming an SiO$_2$ etching mask having openings therethrough on the first $\nu$-type InP layer and then etching the first layer to form the well. The ion implantation or diffusion to form can also be formed in the exposed surface of the second layer using ion implantation and/or diffusion techniques.

The photodetector 50 may be formed by forming an SiO$_2$ etching mask having openings therethrough on the first $\nu$-type InP layer and then etching the first layer to form the well. The ion implantation or diffusion to form the higher conductivity zone can then be done using the same mask. The second layer is then deposited on the first layer including the surfaces of the well.

I claim:

1. An avalanche photodetector for operation of a particular wavelength comprising:
    a substrate of first conductivity type having a first major surface;
    a light-absorptive region of first conductivity type which overlies the first major surface;
    a first region of first conductivity type overlying said absorptive region and having a surface including a central surface area and a surrounding peripheral surface area;
    a zone extending a distance from said central area towards said absorptive region and having a higher conductivity than the remainder of the first region;
    a second region of opposite conductivity type overlying the first semiconductor region;
    a first electrical contact overlying said second region; and
    a second electrical contact to said substrate.

2. The photodetector of claim 1 wherein the areal concentration of conductivity modifiers in the higher conductivity zone is between about 2.5 and $4 \times 10^{12}/cm^2$.

3. The photodetector of claim 2 wherein the first region is between about 1 and 3 micrometers thick and the higher conductivity zone is between about 0.5 and 3 micrometers thick.

4. The photodetector of claim 3 further comprising a buffer region between the absorptive region and the first region.

5. The photodetector of claim 4 wherein the first region is composed of N-type InP, the second region is composed of P-type InP and the absorptive region has $\nu$-type conductivity and is composed of a material selected from a group consisting of In$_{0.57}$Ga$_{0.43}$As and In$_x$Ga$_{1-x}$As$_y$P$_{1-y}$ alloys.

6. The photodetector of claim 1 wherein the first region includes a well extending a distance therein and said central area is the bottom of the well.

7. The photodetector of claim 6 wherein the areal concentration of conductivity modifiers in the higher conductivity zone is between about 2.5 and $4 \times 10^{12}/cm^2$.

8. The photodetector of claim 7 wherein the first region is between about 2 and 6 micrometers thick and the higher conductivity zone is between about 0.5 and 3 micrometers thick.

9. The photodetector of claim 8 further comprising a buffer region between the absorptive region and the first region.

10. The photodetector of claim 9 wherein the first region is composed of N-type InP, the second region is composed of P-type InP and the absorptive region has $\nu$-type conductivity and is composed of a material selected from a group consisting of In$_{0.57}$Ga$_{0.43}$As and In$_x$Ga$_{1-x}$As$_y$P$_{1-y}$ alloys.

* * * * *